United States Patent
Guzik et al.

(10) Patent No.: US 10,115,420 B2
(45) Date of Patent: Oct. 30, 2018

(54) HEAD GIMBAL ASSEMBLY (HGA) SUPPORT CARTRIDGE FOR MAGNETIC HEAD AND DISK TESTERS

(71) Applicant: Guzik Technical Enterprises, Mountain View, CA (US)

(72) Inventors: Nahum Guzik, Palo Alto, CA (US); Konstantin Perevoztchikov, Saratoga, CA (US); Wei Zhuang, San Francisco, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/081,299

(22) Filed: Mar. 25, 2016

(65) Prior Publication Data
US 2016/0284369 A1 Sep. 29, 2016

Related U.S. Application Data

(60) Provisional application No. 62/138,105, filed on Mar. 25, 2015.

(51) Int. Cl.
*G11B 5/455* (2006.01)
*G01R 33/12* (2006.01)

(52) U.S. Cl.
CPC ........ *G11B 5/4555* (2013.01); *G01R 33/1207* (2013.01)

(58) Field of Classification Search
CPC ... G11B 5/455; G11B 5/012; G11B 2005/001; G11B 27/36; G01R 33/1207; G01R 33/02
USPC ........................................................ 324/212
See application file for complete search history.

(56) References Cited

U.S. PATENT DOCUMENTS

| 4,902,971 | A | * | 2/1990 | Guzik | G11B 5/012 324/212 |
| 5,339,702 | A | * | 8/1994 | Viches | G11B 5/4806 324/212 |
| 5,742,446 | A | * | 4/1998 | Tian | G11B 5/6005 324/210 |
| 5,801,531 | A | * | 9/1998 | Viches | G11B 5/012 324/212 |
| 6,006,614 | A |   | 12/1999 | Guzik et al. | |

(Continued)

OTHER PUBLICATIONS

Guzik Product Bulletin: Guzik V2002 Spinstand with XY-Positioning for Head, Headstack and Disk Testing, Guzik Part No. 02-107178-07, Rev. Sep. 17, 2007.

*Primary Examiner* — Jermele M Hollington
*Assistant Examiner* — Christopher McAndrew
(74) *Attorney, Agent, or Firm* — Burns & Levinson, LLP; Joseph M. Maraia (57) ABSTRACT

A unitary cartridge, or module, provides a self-contained, high accuracy, ready-to-use assembly for controlling fine positioning of a head gimbal assembly (HGA) disposed on a head mounting unit mounted on the cartridge, with respect to a spinstand or other device associated with a head tester. In a form, the head-mounting unit and a counterweight element are configured to be moveable relative to the base in opposite directions along a displacement axis in response to actuators in the cartridge, and are operative in concert with a damping assembly configured to interact with the counterweight element and the heads mounting unit to mitigate vibrational movement of the cartridge.

20 Claims, 8 Drawing Sheets

(56) References Cited

U.S. PATENT DOCUMENTS

| | | | | |
|---|---|---|---|---|
| 6,212,045 B1 * | 4/2001 | Guzik | G11B 17/038 | 324/212 |
| 6,229,664 B1 * | 5/2001 | Albrecht | G11B 5/4886 | 324/212 |
| 6,344,738 B1 * | 2/2002 | Garcia | G01R 33/1207 | 324/212 |
| 6,646,436 B2 * | 11/2003 | Mihara | G11B 5/4826 | 324/212 |
| 6,930,850 B2 * | 8/2005 | Takagi | G11B 5/59611 | 360/75 |
| 7,196,513 B2 * | 3/2007 | Perez | G11B 5/012 | 324/210 |
| 7,239,486 B2 * | 7/2007 | Johnson | G11B 5/4833 | 360/264.7 |
| 7,532,006 B2 * | 5/2009 | Guzik | G11B 5/455 | 324/210 |
| 7,542,868 B2 * | 6/2009 | Herdendorf | G11B 5/4826 | 360/245 |
| 7,814,643 B2 * | 10/2010 | Johnson | G11B 5/4833 | 29/603.03 |
| 7,880,463 B2 * | 2/2011 | Guzik | G11B 5/4555 | 324/212 |
| 7,880,987 B2 * | 2/2011 | Belmont | G11B 5/5534 | 324/212 |
| 8,093,888 B2 * | 1/2012 | Yamasaki | G11B 5/455 | 324/212 |
| 8,094,414 B1 * | 1/2012 | Cheng | G11B 5/4826 | 360/244.5 |
| 8,139,306 B2 * | 3/2012 | Feng | G11B 5/40 | 324/212 |
| 8,169,750 B1 * | 5/2012 | Guzik | G11B 5/455 | 318/593 |
| 8,270,118 B1 * | 9/2012 | Cheng | G11B 5/4555 | 324/212 |
| 8,487,609 B2 * | 7/2013 | Lacey | G11B 5/4555 | 324/210 |
| 2002/0027435 A1 * | 3/2002 | Sorenson | G11B 17/0287 | 324/212 |
| 2004/0183527 A1 * | 9/2004 | Mori | G11B 5/00 | 324/212 |
| 2006/0103382 A1 * | 5/2006 | Mihara | G11B 5/4555 | 324/262 |
| 2007/0018640 A1 * | 1/2007 | Guzik | G11B 5/012 | 324/212 |
| 2011/0211280 A1 * | 9/2011 | Chen | G11B 5/4833 | 360/254 |

\* cited by examiner

HEAD GIMBAL ASSEMBLY (HGA) SUPPORT CARTRIDGE FOR MAGNETIC HEAD AND DISK TESTERS

REFERENCE TO RELATED APPLICATION

This application claims priority to U.S. Provisional Patent Application Ser. No. 62/138,205, filed Mar. 25, 2015, incorporated by reference herein.

FIELD OF THE INVENTION

The present invention relates to magnetic head and disk testers and in particular to head fine positioning mechanisms with improved dynamic characteristics.

BACKGROUND OF THE INVENTION

A head/disk tester is an instrument that is used for testing the characteristics of magnetic heads and disks, such as a signal-to-noise ratio, track profile, etc. The tester should simulate those motions of the head with respect to the disk that occur in an actual hard disk drive during operation. A tester comprises a mechanical component, commonly referred to as a spinstand, that performs movements of the head with respect to the disk, and an electronic component that is responsible for measurement, calculation, and analysis of the measured signal.

Examples of prior art spinstands for a head and disk tester include the Guzik V2002 XY-positioning spinstand and the Guzik S-1701B Micro Positioning spinstand, both of which are available from the assignee of the present disclosure, Guzik Technical Enterprises, 2443 Wyandotte Street, Mountain View, Calif. 94043, USA (www.guzik.com).

Figure 1:
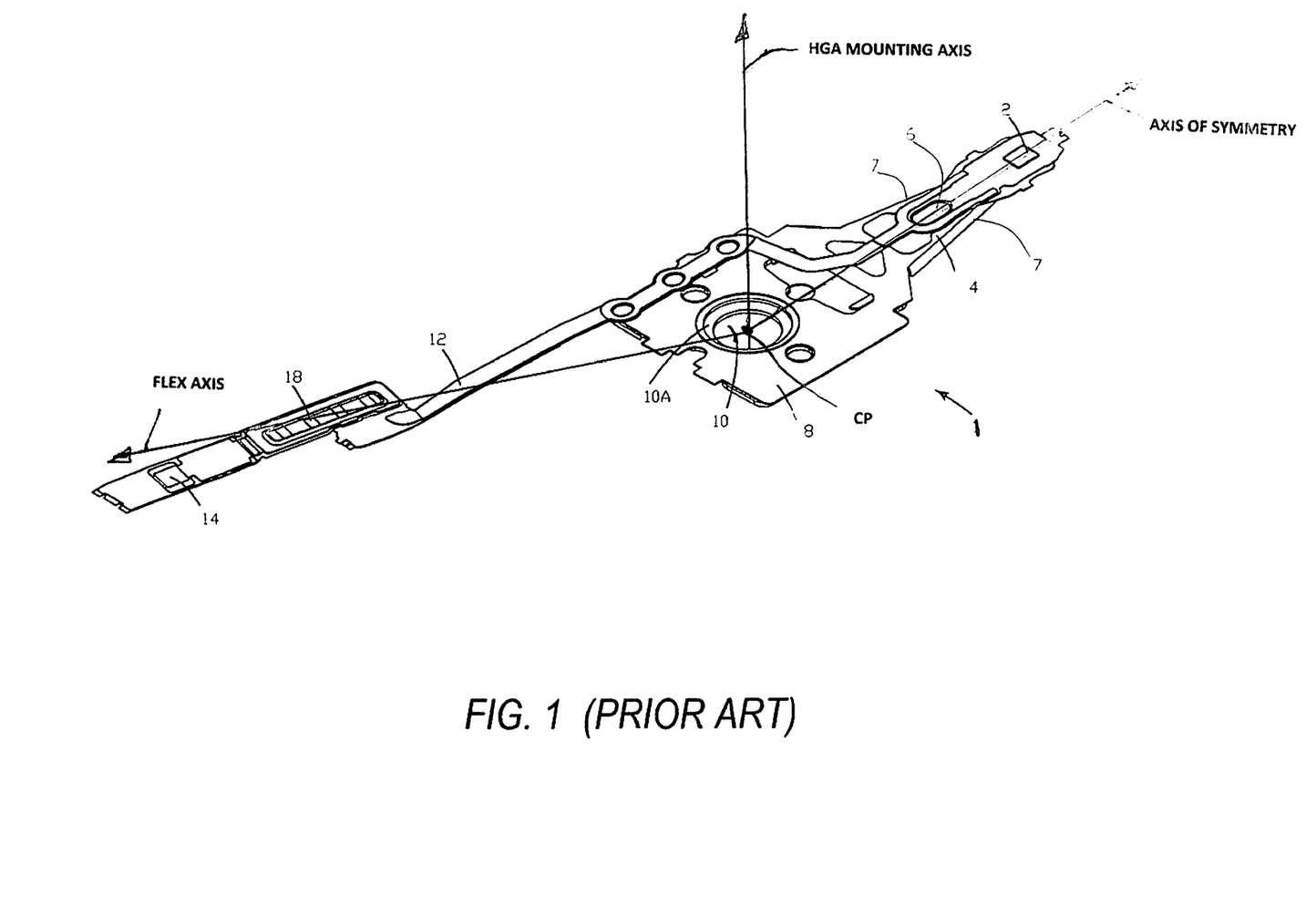
FIG. 1 is a perspective view of an exemplary prior art head gimbal assembly.

For testing, a magnetic read/write head is usually incorporated into a structure known as a head gimbal assembly (HGA). An exemplary HGA 1 is shown in FIG. 1. The basic components of an HGA 1 are a head 2, an elongated load beam 4 bearing the head at a distal end, a tooling hole 6, a base plate 8 having a planar mounting surface, a boss hole 10 with an angled surface 10a, and an elongated flex circuit support sheet element 12 with an array of electrically conductive pads 18 at its distal end. The boss hole 10 passes through base plate 8 and is characterized by a radius R about an HGA mounting axis perpendicular to the planar mounting surface of base plate 8. The head 2 is disposed along an "axis of symmetry" extending along the load beam 4 from the center point CP of the boss hole 10 to head 2. The array of electrical contacts 18 is disposed along a "flex axis" extending from the center point CP of the boss hole 10 to array 18. The tooling hole 6 is on load beam 4, between the boss hole 10 and head 2. The boss hole 10 and the tooling hole 6 (sometimes) are used, in the prior art, for orientation of the HGA in a plane transverse to an HGA mounting axis. The angled surface 10a of the boss hole 10 is used for clamping the HGA to an HGA support assembly associated with a spinstand. The flex circuit sheet element 12 is used to support electrical connections of the head of the HGA, by way of pads 18, to an external head preamplifier (not shown). Generally, the base plate 8 and load beam 4 are relatively stiff compared to the flex circuit sheet element 12.

In order to test a head with a spinstand, an HGA is loaded to an HGA support assembly associated with the tester. The HGA is mechanically coupled to a corresponding component of the spinstand, and electrically connected to spinstand preamplifiers which provide test signals and receive back response signals from the head under test. To make these operations possible, an alignment of the HGA relative to the spinstand is carried out. In FIGS. 2-5, and the text below, HGAs 1 are illustrated only by their load beam (which is identified with the HGA's reference numeral 1); the other elements of the HGAs, and portions of a tester for applying test signals to and analyzing responses from the HGAs, although present in the illustrated and described HGAs, are not shown in the figures.

A major step forward in improvement of the qualitative parameters of spinstands was made in the U.S. Pat. No. 8,169,750. In that patent, a spinstand is described that includes a base, a Y coarse positioning stage that moves in a Y direction and a X coarse positioning stage that is movable in a X direction, where the X and Y directions are defined with respect to an x-y-z Cartesian coordinate system. The X coarse positioning stage is coupled to the Y coarse positioning stage by a linear bearing. An X precision (or fine motion) positioning stage, movable in an X direction, is mounted on the X coarse positioning stage. The X precision positioning stage comprises a piezo-electric actuator and a parallelogram flexure assembly (or parallelogram) having a base element rigidly mounted to the X coarse positioning stage, and a movable (with respect to the X coarse positioning stage) element maintained parallel to the base element by a pair of equal length end elements flexure-coupled to the base element and the movable element. These components make possible movement of the X precision positioning stage in the X direction. Position feedback for X precision positioning stage is provided by a displacement sensor that comprises a linear glass scale mounted to the moving element of the parallelogram disposed opposite to an optical reader mounted to the X coarse positioning stage. The sensor carries out measurement of the displacement of the moving element of the parallelogram relative to the X coarse positioning stage, and produces in that way information of the read/write head position.

The spinstand also includes a removable HGA-bearing-only cartridge that enables magnetic head and disk testing using different magnetic heads with the possibility of quick installation of a head and quick dismount of the head from the cartridge without special tools or alignment procedures. The cartridge is rigidly coupled to the moving element of the parallelogram, which is located on the X precision positioning stage. A head gimbal assembly HGA mounts on the cartridge. A read/write head is a part of HGA. To move the read/write head, a piezo-electric actuator mounted on the X precision stage drives the parallelogram to move the cartridge, which typically has a mass that exceeds 500 grams. These large mass results in relatively slow movement and a relatively low mechanical bandwidth compared to generally desired movements and bandwidths.

A substantial improvement of spinstand parameters was achieved in the cited '750 patent by introducing an additional piezo-electric actuator that acts on the head-mounting unit. Such an actuator is mounted on the base of the cartridge and moves the relatively low mass head-mounting unit (compared to the above described head-mounting unit) together with the read/write head directly. The reduction of the mass of the head-mounting unit leads to corresponding widening of the mechanical bandwidth and an increase in movement speed. As a result, the accuracy of the read back process is improved, since the wider bandwidth extends the ability of the head to follow applied servo commands.

Along with the noted positive properties applicable to operation in a servo read mode, a cartridge and spinstand according to the U.S. Pat. No. 8,169,750 has a serious drawback that limits positioning accuracy in a servo write mode. In an embodiment described in the '750 patent, the position of read/write head in the servo write mode is changed by a piezo actuator acting on the parallelogram of the X precision positioning stage, and the change in position is measured by a glass scale on that stage. The piezo actuator on the cartridge is not used in that measurement of position change. For this reason, the movement is slow and servo writing takes a relatively long time. Moreover, the distance between the HGA and glass scale is relatively large and variations of that distance due to temperature changes, vibrations etc. create positioning errors during servo writing. For these reasons, the systems of U.S. Pat. No. 8,169,750 did not improve spinstand performance in a servo write mode.

Another disadvantage of prior art spinstands, is connected to vibrational movement of the components that support the HGA. To move the head-mounting unit, the piezo-electric actuator acts on that unit with a force F directed along a displacement axis. According to a law of physics, the force F evokes a counteractive force R that is applied to the actuator and through the actuator to the cartridge itself. At each positioning operation, the counteractive force R causes oscillations of the cartridge base together with the adjacent components. For this reason, measurement of the HGA position cannot be initiated until the system has settled down to a substantially stable condition. Thus occurrence of the counteractive force R brings about degradation of the positioning accuracy and increase of the settling time.

To reduce vibration of the cartridge base it was proposed in U.S. Pat. No. 6,006,614, issued on Dec. 28, 1999, assigned to the assignee of this disclosure, to complement the head-mounting unit by a counterweight. According to that proposal, two piezo-electric actuators are mounted on a precision positioner. During positioning of an HGA, the two actuators act simultaneously on the head-mounting unit and on the counterweight, with equal magnitude forces in opposing directions along the displacement axis. In this case, two counteraction forces appear where the forces are of equal magnitude and are oppositely directed. As a result, the composite force applied to the positioner turns out to be of negligible magnitude, so that the cause of vibrations is eliminated or reduced significantly.

However, there is a necessary condition for effective suppression of system vibrations by counterweight introduction: the product of the mass of the head-mounting unit by the expansion coefficient of the actuator that advances the head-mounting unit, should equal the product of the mass of the counterweight by the expansion coefficient of the actuator that advances the counterweight. The practice of using a positioner with an added counterweight showed that it is was difficult to achieve sufficiently accurate fulfillment of this condition, especially for the case of high frequency vibration.

More importantly, it has been determined that the introduction of counterweight suppresses vibration in the cartridge base only, and it does not affect the vibration of a head-mounting unit itself and of the counterweight. Therefore, the introduction of a counterweight does not solve the problem of vibration completely.

The goal of the current invention is to effect an HGA positioning cartridge that eliminates the above-outlined disadvantages and thereby improves the head positioning accuracy with simultaneous reduction of the settling time.

SUMMARY

According to the present invention, a unitary cartridge, or module, provides a self-contained, high accuracy, ready-to-use assembly for controlling fine positioning of an HGA-bearing head mounting unit mounted on the cartridge, with respect to a spinstand or other device associated with a head tester.

In a form, a head gimbal assembly (HGA) support cartridge, or module, for a magnetic head tester is provided for a head tester which includes (i) a base having a support surface for receiving on, and securing, an HGA support cartridge, and (ii) a spinstand for supporting a magnetic disk and spinning the disk about a spin axis SA.

The head gimbal assembly (HGA) support cartridge, or module, having a parallelogram support assembly including (i) an HGA support parallelogram element extending a distance D1 about and along a displacement axis DA from an HGA support (HGAS) end to a displacement force receiving (DFR) end, (ii) a base parallelogram element extending a distance D1 in a direction parallel to the displacement axis DA from an HGA support (HGAS) end to a displacement force receiving (DFR) end, (iii) a first parallelogram end element extending a distance D2 between the HGA support (HGAS) end of the HGA support parallelogram element and the HGA support (HGAS) end of the base parallelogram element, and (iv) a second parallelogram end element extending a distance D2 between the displacement force receiving (DFR) end of the HGA support parallelogram element and the displacement force receiving (DFR) end of the base parallelogram element.

The base parallelogram element has a cartridge coupling surface shaped to be selectively received by and secured to the cartridge support surface of the head tester whereby the displacement axis DA is perpendicular to spin axis SA of the spinstand. The base parallelogram element also has a parallelogram base surface facing away from the cartridge coupling surface and on a side of the base parallelogram element opposite to the cartridge coupling surface of the base parallelogram element, and extending between the HGA support (HGAS) end to a displacement force receiving (DFR) end of the base parallelogram element in a direction parallel to the displacement axis DA.

The HGA support parallelogram element has an HGA coupling surface adapted to selectively receive thereon at or near the HGA support (HGAS) end, an HGA support element bearing an HGA. The HGA support parallelogram element also has an undersurface on a side of the HGA support parallelogram element opposite to the HGA coupling surface and facing the base surface of the base parallelogram element, and extending in a direction parallel to the displacement axis DA.

A first end of the first parallelogram end element is coupled to the HGA support (HGAS) end of the HGA support parallelogram element by a flexure. A second end, opposite the first end, of the first parallelogram end element is coupled to the HGA support (HGAS) end of the base parallelogram element by a flexure.

A first end of the second parallelogram end element is coupled to the displacement force receiving (DFR) end of the HGA support parallelogram element by a flexure, and a second end, opposite the first end, of the second parallelogram end element is coupled to the displacement force receiving (DFR) end of the base parallelogram element by a flexure.

A counter force assembly is disposed along the DA axis and opposite the parallelogram support assembly. The counter force assembly includes a counterweight disposed along the axis DA and an associated structure to limit motion of the counterweight to be along the axis DA.

A rigid actuator housing rigidly is coupled to the parallelogram support assembly along the axis DA between the parallelogram support assembly and the counter force assembly, and is rigidly coupled to the base parallelogram element. The actuator housing includes a rigid plate extending transverse to the axis DA defining a first open-faced void region extending from a first side of the plate and extending toward the displacement force receiving (DFR) end of the HGA support parallelogram element. A first piezo actuator is disposed in the first open-faced void region and an associated coupling rod for applying a force relative to the plate to the displacement force receiving (DFR) end of the HGA support parallelogram element in the direction of the axis DA.

The rigid plate of the actuator housing also defines a second open-faced void region extending from a second side opposite the first side of the plate and extending toward the counterweight assembly. A second piezo actuator is disposed in the second open-faced void region and an associated coupling rod for applying a force relative to the plate to the counterweight in the direction of the axis DA.

With this structure, the base parallelogram element, the HGA support parallelogram element, the first parallelogram end element and the second parallelogram end element, with the flexures, define a parallelogram structure wherein the HGA support parallelogram element is movable in the direction of the axis DA in response to a force applied thereto by the first piezo actuator to the displacement force receiving (DFR) end of the HGA support parallelogram element and the counterweight is movable in the direction of the axis DA in response to a force applied thereto by the second piezo actuator to the counterweight.

With the disclosed structure, positional errors are highly reduced, or eliminated, by measuring the position of an HGA relative to a cartridge itself, from the perspective of the cartridge. For this purpose, a displacement sensor is made a part of the cartridge: for example, a glass scale is coupled to the head-mounting unit and an optical reader is mounted on the cartridge base. That structure provides highly accurate positional information for the HGA.

Moreover, high suppression of vibration during positioning of the head-mounting unit is established by a novel construction that combines use of a counterweight with a damping mechanism. A combination of the counterweight with a damping mechanism suppresses vibration not only in the cartridge base, but also in the head-mounting unit itself, and in the counterweight as well. That configuration is considerably less sensitive to an imbalance between mechanical properties of the head-mounting unit and the counterweight, compared to systems of the prior art.

DETAILED DESCRIPTION

Figure 2:
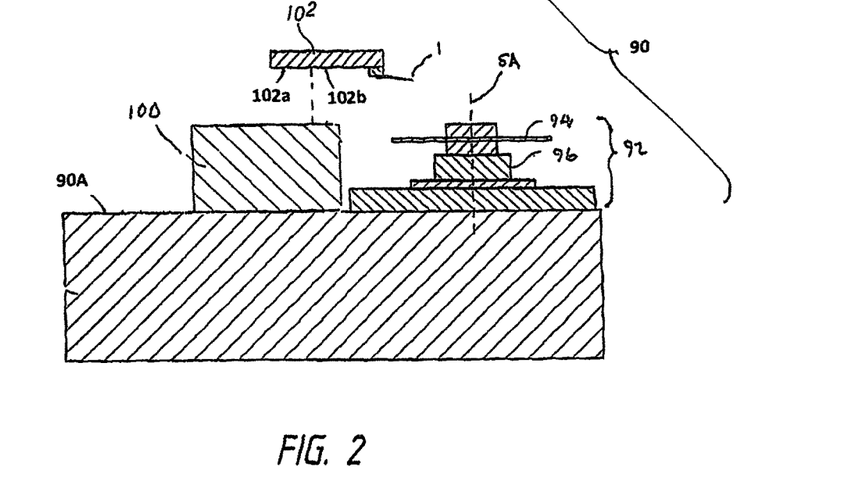
FIGS. 2 and 3 are side cross-section schematic representations of a cartridge according to an embodiment of the present disclosure mounted to a head tester, including a spinstand of the head tester and a disk to be tested, with an HGA support element/module bearing an HGA about to be mounted and tested (FIG. 2) and mounted in position to be tested (FIG. 3).
Figure 3:
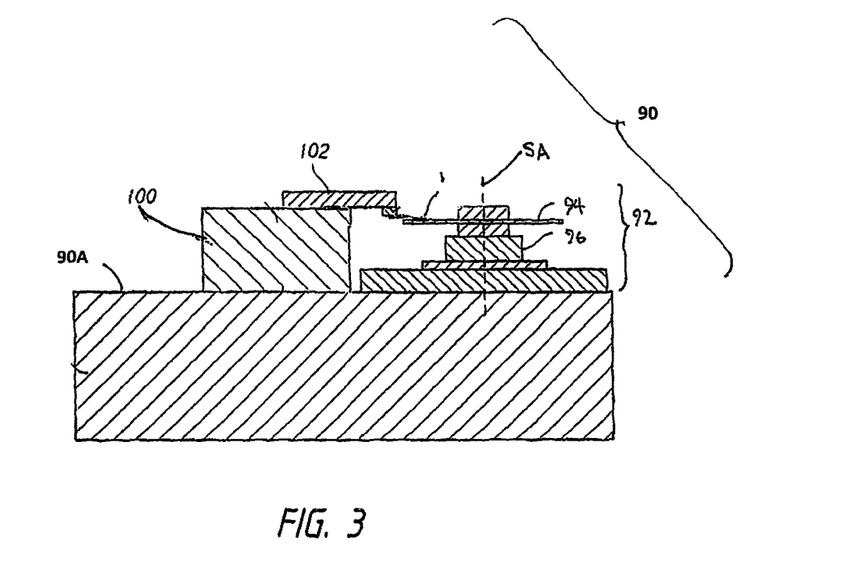

FIGS. 2 and 3 show a schematic cross-section representation of an exemplary cartridge 100 according to an embodiment of the present disclosure, mounted to an upward facing surface 90A of a head tester 90. Head tester 90 includes a spinstand 92 of the head tester and is shown with a disk 94 mounted for testing. Spinstand 92 includes a rotary actuator 96 mounted on top surface 90A for spinning the disk 94 about a spin axis SA. FIG. 2 shows an HGA support element/module 102 bearing an HGA 1 overlying and about to be mounted to cartridge 100 and tested. FIG. 3 shows the configuration of FIG. 2, with HGA support element/module 102 bearing the HGA 1 mounted in position to be tested. In the exemplary embodiment of cartridge 100 in FIGS. 2-3, the lower (as shown) facing surface 102a, 102b of HGA support element/module 102 is adapted for fixture to an upward (as shown) facing surface of cartridge 100, and also serves as a downward (as shown) facing mounting surface for HGA 1.

Figure 4:
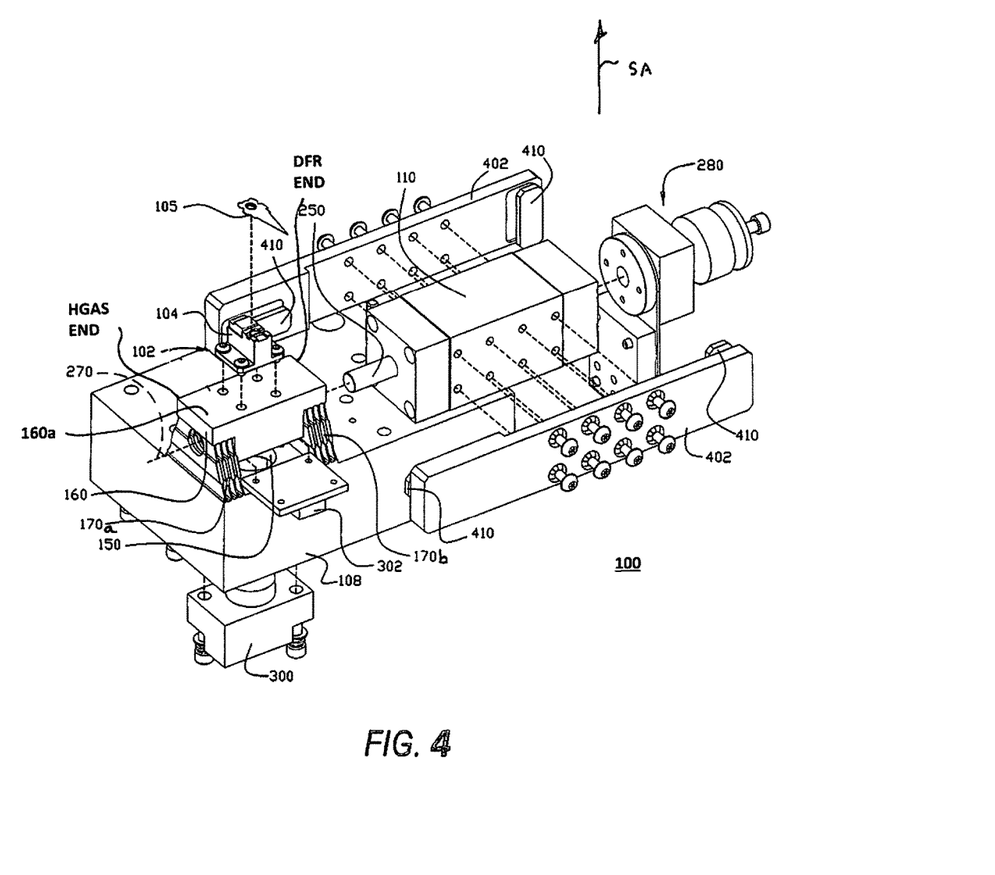
FIG. 4 and FIG. 5 are perspective, exploded views, from opposite ends, of an exemplary cartridge according to an embodiment of the present disclosure.
Figure 5:
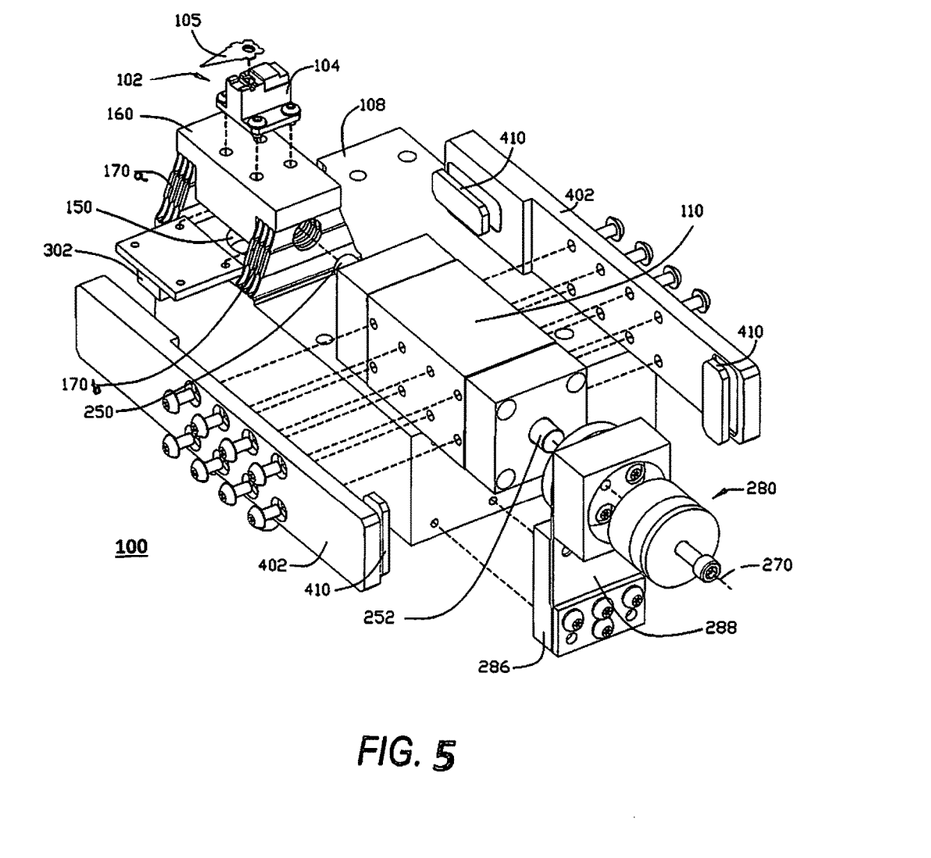

FIGS. 4-8 show detailed diagrams of another exemplary form of a cartridge 100 of the present disclosure from different points of view. Perspective, exploded front and rear views of cartridge 100 are shown in FIGS. 4 and 5, respectively, with an HGA 1 mounted to a head-mounting unit 102, which in turn is mounted on an upward-facing receiving surface 160a of element 160, with that surface 160a forming a mounting platform.

Figure 6:
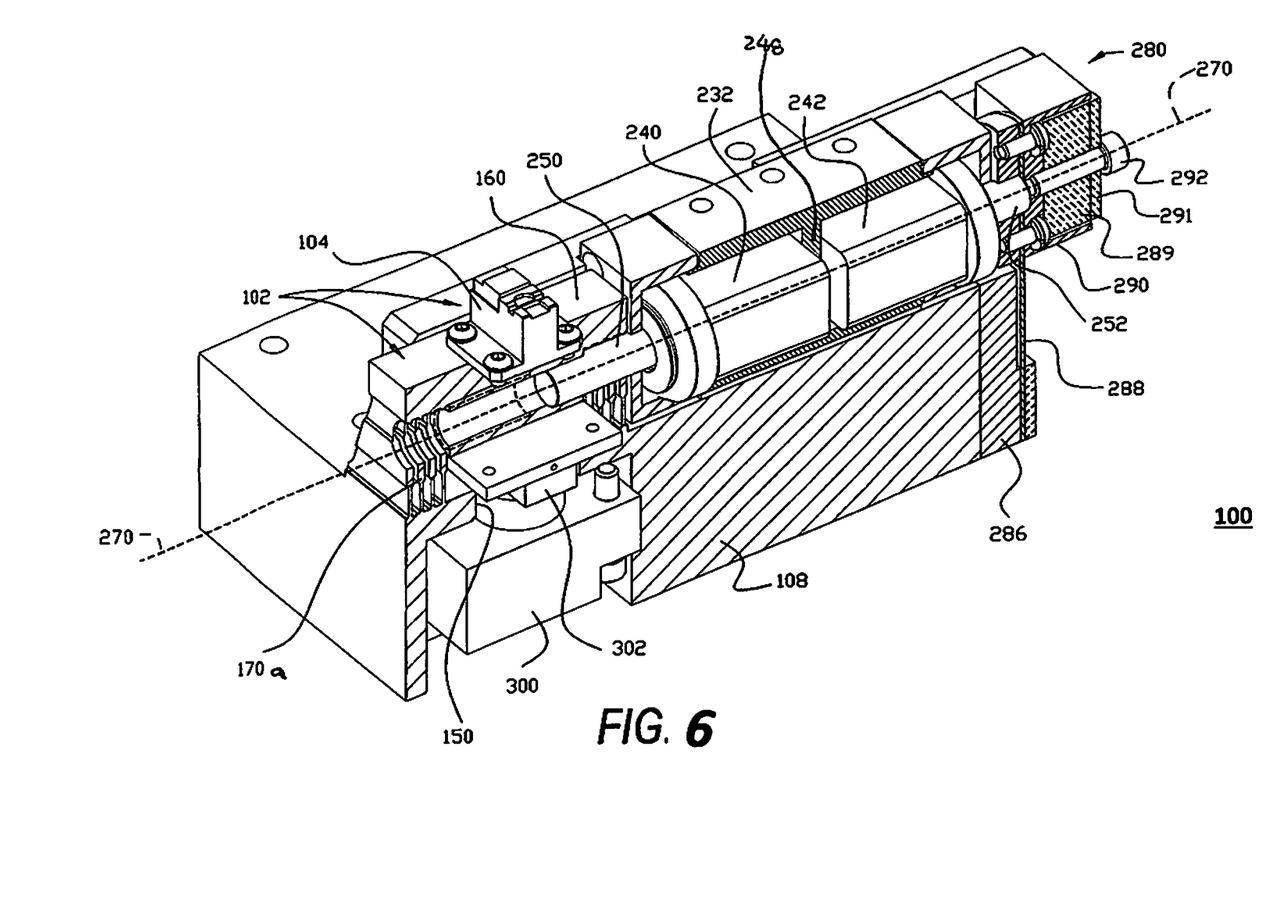
FIG. 6 is a partial cross-sectional view of the exemplary cartridge of FIG. 4.
Figure 7:
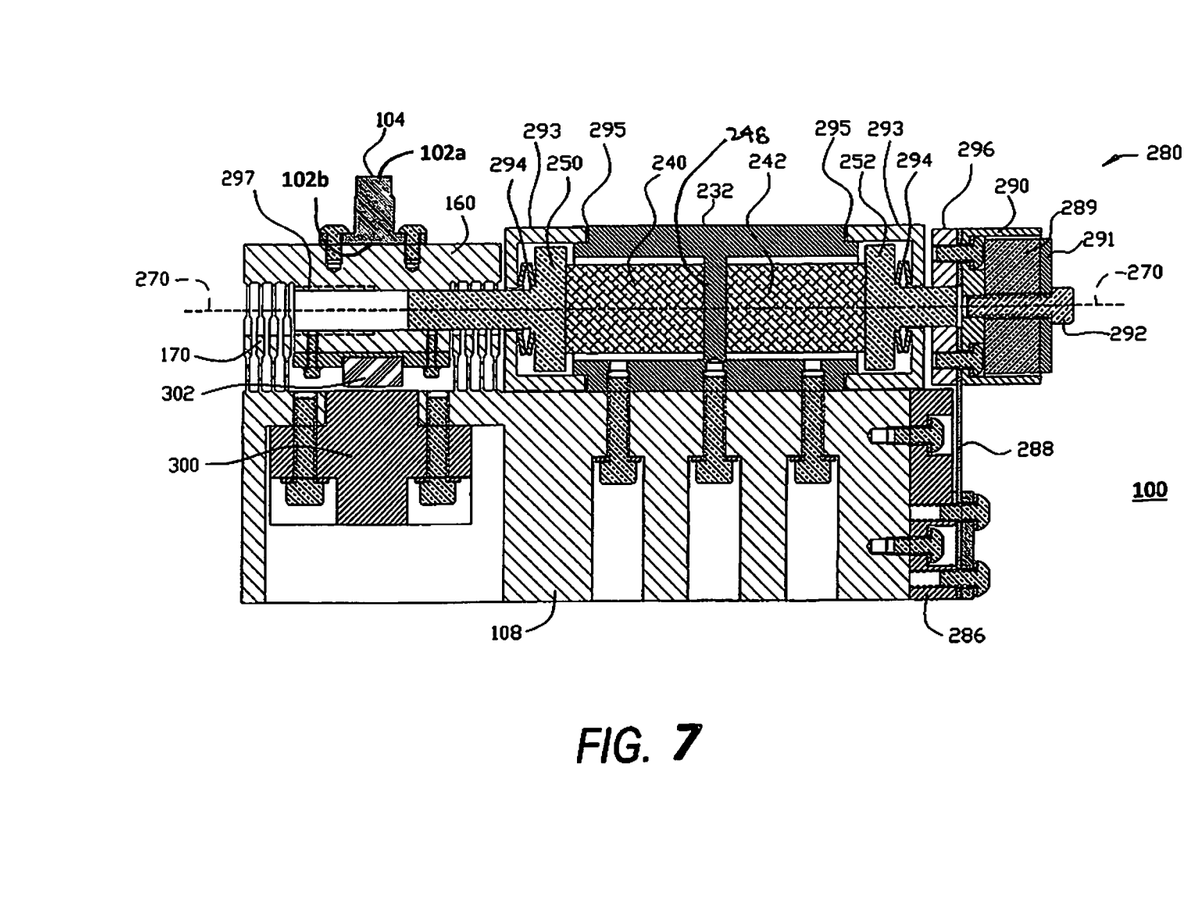
FIG. 7 is a side cross-sectional view of the exemplary cartridge of FIG. 4.
Figure 8:
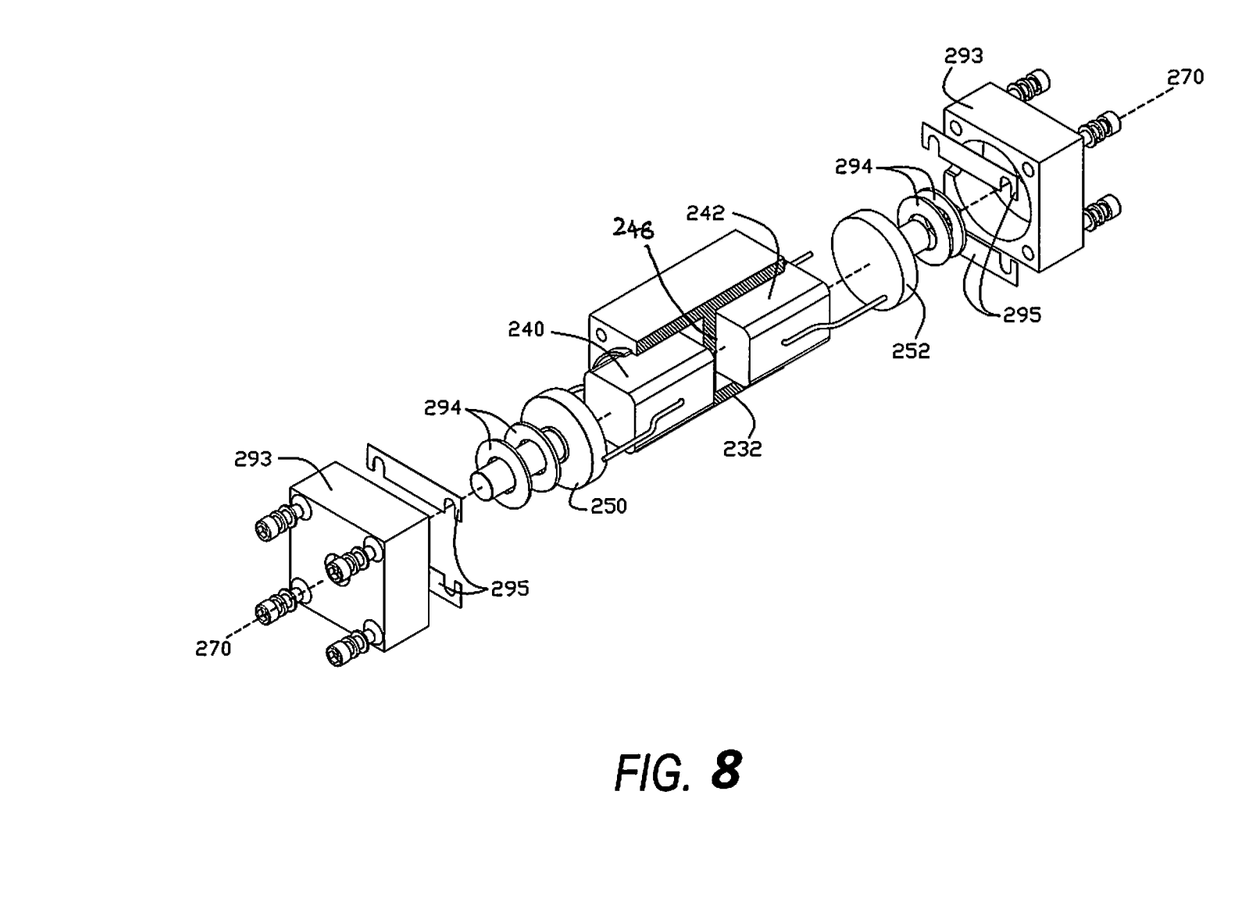
FIG. 8 shows a preassembled stage of an actuator assembly of the exemplary cartridge of FIG. 4.

FIG. 6 shows a partial cut-away perspective view of the cartridge 100 of FIG. 4, particularly showing actuators 240 and 242 and their surrounding structures. FIG. 7 shows a side cross-sectional view of cartridge 100. FIG. 8 shows a perspective, exploded view of the interconnected components of the actuator assembly of the cartridge 100 of FIG. 4.

As seen in the embodiment of FIGS. 4-8, a cartridge 100 includes a cartridge base 108 that carries a head-mounting unit 102. The head-mounting unit 102 includes a HGA mounting block 104 affixed to an upward-facing surface 160a of element 160, forming a mounting platform. A head gimbal assembly HGA 1 is mounted on the upward facing surface 102a on the HGA mounting block 104 of the head-mounting unit 102. The mounting platform formed by the head-mounting unit 102 extends along, and is adapted for translation along, a displacement axis (DA) 270, as described below.

As shown, mounting block 160 has a "T-shaped" cross-section along displacement axis (DA) 270. The uppermost portion of mounting block 160 forms an HGA support parallelogram element 160 extending a distance D1 along a displacement axis DA from an HGA support (HGAS) end to a displacement force receiving (DFR), with the upward-facing surface 160a of mounting block 160 forming a mounting surface for receiving head-mounting unit 102 and HGA mounting block 104.

A base parallelogram element extending a distance D1 in a direction parallel to the displacement axis DA from an HGA support (HGAS) end to a displacement force receiving (DFR) end is integral with an uppermost region of the top portion of base 108.

A first parallelogram end element (flexures 170a) extends a distance D2 between the HGA support (HGAS) end of the HGA support parallelogram element (mounting platform 160) and the HGA support (HGAS) end of the base parallelogram element (portion of base 108). The first parallelogram end element is in the form of a set of multi-leaf, parallel, equal length (and transverse to the displacement axis 270) elastic flexures 170a.

A second parallelogram end element (flexures 170b) similarly extends a distance D2 between the displacement force receiving (DFR) end of the HGA support parallelogram element (mounting platform 160) and the displacement force receiving (DFR) end of the base parallelogram element (portion of base 108). The second parallelogram end element is in the form of a set of multi-leaf, parallel, equal length (and transverse to the displacement axis 270) elastic flexures 170b.

Thus, the opposite ends (along displacement axis 270) of the mounting platform 160 (the HGA support parallelogram element) having length D1, is connected to the underlying portion of cartridge base 108 (the base parallelogram element) having length D1, by multi-leaf, parallel, equal length D2 (and transverse to the displacement axis 270) respective sets of elastic flexures 170a and 170b, thereby forming a parallelogram structure The parallel elements of the elastic flexures 170 for the parallelogram end elements each include: (i) a relatively flexible flexure portion at the junction of the parallel elements of the first end elements and the HGA support (HGAS) end of the HGA support parallelogram element and the HGA support (HGAS) end of the base parallelogram element, and (ii) a relatively flexible flexure portion at the junction of the parallel elements of the respective end elements and the displacement force receiving (DFR) end of the HGA support parallelogram element and the displacement force receiving (DFR) end of the base parallelogram element, and (iii) relatively stiff planar core portions extending between the flexure portions of each of the parallel elements wherein the core portions are mutually parallel and nominally perpendicular to the displacement axis (DA) 270 (depending on the position along the displacement axis DA at any given time, of the (slightly) moveable HGA support parallelogram element, with respect to the stationary base parallelogram element of cartridge base 108

The parallelogram structure enables (slight, or fine) movement of head-mounting unit 102 (and HGA 1) relative to the cartridge base 108 along the displacement axis (DA) 270, while limiting movement of head-mounting unit 102 in directions transverse to the displacement axis 270. As a result, that movement of mounting platform 160 is constrained to be substantially parallel to the displacement axis (DA) 270. An actuator assembly 110 drives the head-mounting unit 102 relative to the cartridge base 108 in the direction of the displacement axis 270 by an elongated rod 250.

In the illustrated form of FIGS. 4-8, a displacement sensor assembly generates a signal representative of the displacement, or movement, of head-mounting unit 102 (and HGA 1) relative to the fixed cartridge base 108 along the displacement axis (DA) 270. In the illustrated form, the displacement assembly includes a moving part of the sensor (affixed to the HGA support parallelogram element formed by the underside of mounting platform 160), and a stationary part (affixed to the upward-facing base parallelogram element formed on base 108). The moving part of the displacement sensor assembly, is in the form of a glass scale 302 which is coupled to the underside of the mounting platform 160, facing downward, while the stationary part of the displacement sensor assembly, namely, an optical source and reader 300, is mounted on the cartridge base 108, facing glass scale 302.

To make efficient interaction between the optical source and reader 300 and glass scale 302, optical source and reader 300 is disposed in a cavity 150 that is formed in the cartridge base 108 and extends through the cartridge base 108. Such a construction enables passage of light from the optical source and reader 300 to glass scale 302 and for reflected light to pass from glass scale 302 back to optical source and reader 300. The signal produced by optical source and reader 300 provides a highly accurate indication of movement of the head-mounting unit 102 and of the HGA 1 relative to the cartridge base 108, along the displacement axis (DA) 270.

The incorporation of the optical source and reader 300 and the scale 302 into the cartridge 100 itself provides various advantages that have been unavailable in prior art. The measurement of displacements at the intersection of the HGA 1 and the cartridge base 108 ensures a superior accuracy and reduces or eliminates errors caused by indirect measurements and errors attributable to deflection, expansion and/or other positional variations of intervening interfaces or intersections between different components. Accordingly, the described embodiment of the present disclosure localizes displacement measurements to the HGA 1 itself, an advantage and benefit that has not been achieved in prior systems. This advantageously increases mechanical bandwidth of the system during servo writing by reducing the weight of movable part (moving only the head-mounting unit 102 and the HGA 1 instead of an entire stage, as in prior systems). This permits high bandwidth feedback in the servo writing process (more specifically high bandwidth of the pass from optical reader to the actuator driver), therefore improving accuracy of the writing process. Moreover, such design solution essentially increases the speed of placing an HGA 1 into a required position (in other words reduces the settling time)—an advantage that is difficult to overestimate. The best position of the HGA mounting block 104 is on the centerline of the optical source and reader 300 to guarantee maximum accuracy of HGA 1 positioning.

Along with an embodiment of the present disclosure that uses multi-element glass scale-based optical sensors, other embodiments are possible that use different positional measurement devices. The displacement-sensing assembly can include, for example, contact or non-contact sensors, for example, linear displacement sensors, capacitive displacement sensors, ultrasonic wave sensors, eddy current sensors, inductive sensors, magneto-inductive sensors, confocal sensors, laser sensors, LED sensors and ultrasonic sensors.

To suppress vibration of the cartridge base 108, a counterweight assembly 280 is incorporated in the cartridge 100. The counterweight assembly 280, shown most clearly in FIGS. 5-8, includes a housing 290 disposed about a cylindrical counterweight 289 disposed along the displacement axis (DA) 270. The housing 290 is coupled to the cartridge base 108 by a flexible flange 288 through a platform 286 in a manner permitting movement of the counterweight assembly 280 substantially only along the displacement axis 270. As described below, the counterweight assembly 280 is coupled to the actuator assembly 110, containing piezo-electric actuators 240 and 242, each for driving a respective one of head-mounting unit 102 and counterweight 289.

The actuator assembly 110 is mounted on the cartridge base 108. The two piezo-electric actuators 240 and 242 of assembly 110 abut different sides of a rigid rest wall 248 extending transverse to displacement axis 270, and shown as a part of actuator base 232 affixed to base 108.

The actuator base 232 is rigidly connected to the cartridge base 108. The first actuator 240 drives the head-mounting unit 102 (and the HGA 1) via the rod 250 along displacement axis (DA) 270. At the same time, the second actuator 242 drives the counterweight assembly 280 via a rod 252 in the opposite direction. The mass of the counterweight assembly 280 is adjusted to be approximately equal to the mass of the head-mounting unit 102, and the elasticity of the flexible flange 286 is adjusted to be in accord with the elasticity of the flexures 170a and 170b. The forces which actuators 240 and 242 apply to the head-mounting unit 102 and the counterweight assembly 280 evoke counteractive forces that are applied to the rest wall of actuator base 232. Since these counteractive forces are of approximately the same magnitude and act in opposite directions, they cancel each other. The composite force that acts through the rest wall 232 on the cartridge base 108 equals the difference between the counteractive forces and is of a negligible value.

FIG. 7 shows details, in a section view, of an exemplary actuator assembly 232, mounting platform 160, HGA mounting block 104, stationary rest wall 248, and counterweight assembly 280. As noted above, the piezo-electric actuator 240 drives mounting platform 160 by elongated rod 250. The rod 250 is preloaded to the piezo-electric actuator 240 by spring washes 294 and preload cap 293. When a control voltage is applied to the piezo-electric actuator 240, the actuator 240 expands and moves the mounting platform 160 in direction of expansion, away from the rest wall 248. Movement in the opposite direction is forced by spring washers 294. To provide movement in both directions, the elongated rod 250 is rigidly held in a circular cross-section hole inside of the mounting platform 160 (preferably by glue).

A similar assembly is used for the counterweight. The elongated rod 252 is preloaded by spring washers 294 and loading cap 293. The rod 252 is rigidly held to counterweight plate 296, preferably by glue. The counterweight includes counterweight cap 290 and selectable counterweights 289 and 291. The weight of these two parts is selected to match the weight of the head mounting unit 102 and to compensate the force difference between piezo-electric actuators 240 and 242.

In the event of a necessary repair, elongated rod 250, can be disassembled from mounting platform 160, For this purpose, a threaded part 297 in mounting platform 160 (FIG. 7) can be used. A proper size of screw can be used to apply disassembly force to elongated rod 250. A similar disassembly can be performed from counterweight side, by a longer screw instead of screw 292. FIG. 8 shows preassembled stage of the piezo-electric actuator assembly.

According to the present disclosure, the stabilizing effect of the counterweight assembly 280 is extended by using a damping assembly. The damping assembly comprises a pair of rigid arms 402 (preferably made of metal) that are coupled, by a set of screws, to the actuator base 232. One distal end of the arm 402 is rigidly positioned along the lateral side of the head-mounting unit 102, while a second distal end of the arm is rigidly positioned along the lateral side of the counterweight assembly 280. A pad 410 made of a compliant, vibration absorbing material, under compression, is disposed between the ends of arms 402 and the adjacent ones of the lateral sides of the head-mounting unit 102, and the lateral sides of the counterweight assembly 280. The construction of the damping assembly ensures a match between forces applied by arms 402 to opposite sides of the head-mounting unit 102 and of the counterweight assembly 280, so that the cumulative force directed transverse in relation to the displacement axis 270 is of a negligible magnitude.

It should be clear for those experienced in the art that the number of arms in the damping assembly may be different from two. The important point is that (a) each of the arms is both rigid and rigidly coupled to the base of the actuators assembly, (b) each of the arms is in contact with a lateral side of the head-mounting unit and a lateral side of the counterweight assembly (via pads 410), so that (c) the damping assembly changes the frequency response of the system, producing a stabilizing effect and makes the movement of the head-mounting unit during positioning of the HGA more even, eliminating jerks and twitching.

As noted above, the arms 402 of the damping assembly stabilize the movement of the head-mounting unit 102 and of the counterweight assembly 280. The damping assembly referable (but not necessarily) contains resilient pads 410 that are interposed between the end of arm 402 and the lateral side of the head-mounting unit 102 and of the counterweight assembly 280. By way of example, the resilient pads 410 may comprise an elastic material, such as rubber, or elastic polymer, such as Sorbothane.

The resilient pads 410 may be adhesively coupled to the elongated arm 402 at its distal end. Again, as noted above, the resilient pads 410 are preferably compressed against the head-mounting unit 102 and against the counterweight assembly 280, by tight attachment of the elongated, preferably high stiffness, arms 402 to the actuator base 232. Typically the applied force compresses resilient pads 410 at about 10% their thickness.

The joint action of the counterweight and the damping mechanism tends to eliminate or at least to reduce the vibration during HGA positioning in the cartridge base 108 and in the head-mounting unit 102 alike. Furthermore, the damping assembly limits movement of the head-mounting unit 102 in a direction transverse to the displacement axis 270.

Figure 9:
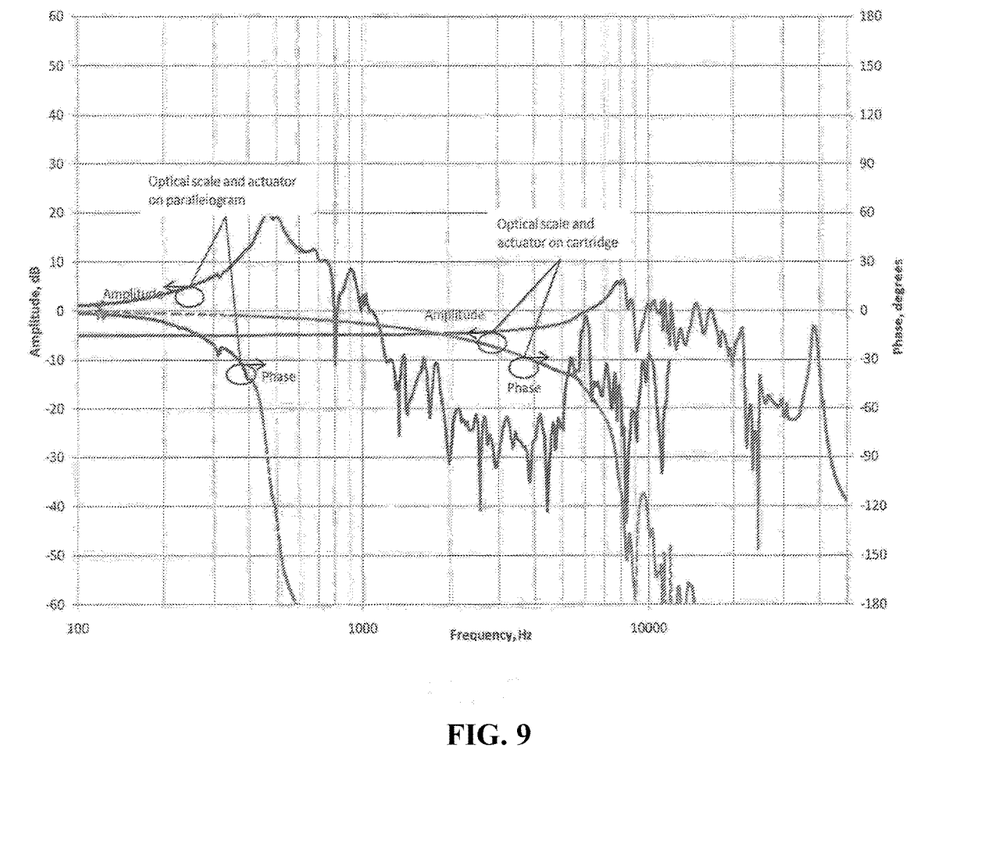
FIG. 9 shows amplitude and phase frequency responses of an exemplary cartridge according to the present disclosure (with an optical scale and actuator on the cartridge), and amplitude and phase frequency responses of a cartridge according to the prior art (with an optical scale and actuator on the parallelogram).

The efficiency of described design was established by comparative test of a cartridge built in the form of the present disclosure, and prior art system with a parallelogram HGA support structure and optical scale with an actuator mounted in the parallelogram. In both cases, measurements are performed in a servo write mode where head position was monitored and controlled using an optical scale. It can be seen (FIG. 9) that resonance on an amplitude response moved from 500 Hz in the case of a parallelogram HGA support structure-only prior art form, to 8 KHz in case of the cartridge built in accord with the present disclosure. That 500 Hz:8 KHz (or 16:1) ratio of bandwidth improvement means that the bandwidth of the control loop is increased proportionally, and the speed of head movement from one position to another is proportionally higher (about 16 times).

Although the foregoing description of the embodiment of the present disclosure contains some details for purposes of clarity of understanding, the disclosure is not limited to the detail provided. There are many alternative ways of implementing the invention. The disclosed embodiment is illustrative and not restrictive.

What is claimed is:

1. A cartridge for magnetic head and disk testers, comprising:
   a cartridge base,
   a mounting platform, including a head mounting unit support surface adapted to receive a head mounting unit,
   a counterweight element,
      wherein the head-mounting unit support surface and the counterweight element are moveable relative to the cartridge base in opposite directions along a displacement axis,
   an actuator assembly for controlling movement of the head-mounting unit support surface and the counterweight element relative to the cartridge base, and
   a displacement sensing assembly positioned beneath the head mounting unit support surface and configured to sense movement of the head-mounting unit support surface relative to the cartridge base along the displacement axis.

2. The cartridge of claim 1 wherein the displacement sensing assembly comprises
   a glass scale coupled to, and underlying, the head-mounting unit support surface and facing in a direction transverse to the displacement axis, and
   an optical reader including an optical source and optical detector, and underlying, the head-mounting unit support surface and mounted on the cartridge base and facing in a direction transverse to the displacement axis,
   wherein the scale and the optical reader are disposed whereby light from the optical source of the optical reader is incident on the glass scale and light from the optical source and incident on and reflected from the glass scale is incident on the optical detector of the optical reader.

3. The cartridge of claim 2 further comprising a damping assembly including at least two elongated arms extending in the direction of the displacement axis that are adapted for contact with opposite lateral sides of a head-mounting unit mounted on the head mounting unit support surface and opposite lateral sides of the counterweight element.

4. The cartridge of claim 3 wherein the elongated arms of the damping assembly are mounted whereby pressure forces applied by the elongated arms to opposite sides of the head-mounting unit and the counterweight element are approximately equal.

5. The cartridge of claim 4 wherein the elongated arms of the damping assembly are coupled to a base of the actuator assembly.

6. The cartridge of claim 4 wherein the elongated arms of the damping assembly are coupled directly to the cartridge base.

7. The cartridge of claim 4 wherein the elongated arms of the damping assembly are made of a relatively stiff material and a relatively resilient material is disposed between each of the elongated arms and the lateral sides of the head-mounting unit and the counterweight element.

8. The cartridge of claim 7 wherein, in an assembled state of the cartridge, the resilient material is compressed against lateral sides of the head-mounting unit and the counterweight element.

9. The cartridge of claim 1, wherein:
   A. the cartridge base extends in the direction of the displacement axis, and includes a cartridge-coupling surface adapted for attachment of the cartridge to a cartridge-receiving surface of a head and disk tester,
   B. the mounting platform is disposed along the displacement axis and extends in a direction transverse to the displacement axis from the cartridge base, and includes:
      i. an HGA support parallelogram element extending a distance D1 between two ends thereof in the direction of the displacement axis,
      ii. a base parallelogram element extending the distance D1 between two ends thereof in the direction of the displacement axis,
      iii. a first parallelogram end element extending a distance D2 between two ends thereof, wherein the two ends are respectively coupled by flexures to first ends of each of the HGA support parallelogram element and the base parallelogram element,
      iv. a second parallelogram end element extending a distance D2 between two ends thereof, wherein the two ends are respectively coupled by flexures to second ends of each of the HGA support parallelogram element and the base parallelogram element,
   wherein the HGA support parallelogram element is adapted to selectively move in the direction of the displacement axis with respect to the base parallelogram element, and
   wherein the HGA support parallelogram element includes the head mounting unit support surface facing away from the HGA support parallelogram element and adapted to receive thereon a head-mounting unit including a head gimbal assembly (HGA) support surface, and an underlying head mounting unit support surface, and
   wherein the head gimbal assembly (HGA) support surface is adapted to receive a head gimbal assembly (HGA) to be tested, and the head mounting unit support surface is adapted for attachment to the head mounting unit support surface of the HGA support parallelogram element.

10. The cartridge of claim 9, wherein the displacement sensing assembly comprises a glass scale coupled to, and underlying, the head-mounting unit support surface and facing in a direction transverse to the displacement axis, and
   an optical reader including an optical source and optical detector, and underlying, the head-mounting unit support surface and mounted on the cartridge base and facing in a direction transverse to the displacement axis,
   wherein the scale and the optical reader are disposed whereby light from the optical source of the optical reader is incident on the glass scale and light from the optical source and incident on and reflected from the glass scale is incident on the optical detector of the optical reader.

11. The cartridge of claim 10, wherein, in the displacement sensing assembly,
   i. the glass scale is disposed in a sidewall of the HGA support parallelogram element facing the base parallelogram element,
   ii. the optical source is disposed on the base parallelogram element underlying the glass scale,
   iii. the optical detector is disposed on the base parallelogram element underlying the scale, and
   iv. a position detection controller for selectively activating the light source to direct an optical beam on the glass scale and receive portions of the optical beam reflected back from the glass scale to the optical detector, and responsive to the received reflected optical beam to determine the position of the HGA support parallelogram element along the displacement axis and with respect to the base parallelogram base element.

12. The cartridge of claim 11, wherein the scale includes a plurality of spaced apart optically detectable markings extending in the direction of the displacement axis and facing the optical detector.

13. The cartridge of claim 9, wherein the actuator assembly includes:
a rigid actuator housing rigidly coupled to the parallelogram support assembly along the displacement axis between the parallelogram support assembly and the counter force assembly and rigidly coupled to the base parallelogram element, wherein the actuator housing includes:
   a. a rigid plate extending transverse to the displacement axis:
      i. defining a first open-faced void region extending from a first side of the plate and extending toward a displacement force receiving (DFR) end of the HGA support parallelogram element, and
      ii. defining second open-faced void region extending from a second side opposite the first side of the plate and extending toward the counterweight assembly, and
   b. a first piezo actuator disposed in the first open-faced void region and an associated coupling rod for applying a force relative to the plate to the displacement force receiving (DFR) end of the HGA support parallelogram element in the direction of the displacement axis; and
   c. a second piezo actuator disposed in the second open-faced void region and an associated coupling rod for applying a force relative to the plate to the counterweight in the direction of the displacement axis;
whereby the base parallelogram element, the HGA support parallelogram element, the first parallelogram end element and the second parallelogram end element, with the flexures, define a parallelogram structure wherein the HGA support parallelogram element is movable in the direction of the displacement axis in response to a force applied thereto by the first piezo actuator to the displacement force receiving (DFR) end of the HGA support parallelogram element and the counterweight is movable oppositely in the direction of the displacement axis in response to a force applied thereto by the second piezo actuator to the counterweight.

14. The cartridge of claim 13, further comprising a damping assembly configured to interact with the counterweight element to mitigate vibrational movement of the cartridge, the counterweight element and the head-mounting unit during counterweight element-driven movement thereof, and to limit movement of the counterweight element and the head-mounting unit, in a direction transverse relative to the displacement axis.

15. The cartridge of claim 14, wherein the damping assembly includes:
(a) a first damping plate extending along the displacement axis between a parallelogram end and a counterweight end, wherein the first damping plate is rigidly coupled to the actuator housing between the parallelogram end and the counterweight end, wherein the parallelogram end of the first damping plate is opposite a first sidewall of the HGA support parallelogram element of the parallelogram support assembly, and the counterweight end of the first damping plate is opposite a first sidewall of the counterweight, and including:
   (i) a block of a vibration-absorbing compliant material disposed between and in intimate contact with the parallelogram end of the first damping plate and the first sidewall of the HGA support parallelogram element of the parallelogram support assembly, and
   (ii) a block of a vibration-absorbing compliant material disposed between and in intimate contact with the counterweight end of the first damping plate and the first sidewall of the counterweight, and
(b) a second damping plate extending along the displacement axis DA between a parallelogram end and a counterweight end, wherein the second damping plate is rigidly coupled to the actuator housing between the parallelogram end and the counterweight end, wherein the parallelogram end of the second damping plate is opposite a second sidewall of the HGA support parallelogram element of the parallelogram support assembly, where the second sidewall is on a side of the HGA support parallelogram element opposite the first sidewall, and the counterweight end of the second damping plate is opposite a second sidewall of the counterweight, and including:
   (i) a block of a vibration-absorbing compliant material disposed between and in intimate contact with the parallelogram end of the first damping plate and the second sidewall of the HGA support parallelogram element of the parallelogram support assembly, and
   (ii) a block of a vibration-absorbing compliant material disposed between and in intimate contact with the counterweight end of the second damping plate and the second sidewall of the counterweight.

16. The cartridge of claim 13, further comprising a controller for selectively applying signals to the respective piezo actuators to effect a desired motion of an HGA coupling surface at an HGA support (HGAS) end of an HGA parallelogram support element bearing a head mounting unit which in turn is bearing a head gimbal assembly (HGA).

17. The cartridge of claim 9, wherein the base parallelogram element, the HGA support parallelogram element, the first parallelogram end element, and the second parallelogram end element and the flexures interconnecting the respective parallelogram elements, form a parallelogram structure.

18. The cartridge of claim 17, wherein the parallelogram elements are relatively stiff compared to the flexures.

19. The cartridge of claim 18, wherein the parallelogram elements are made of metal.

20. The cartridge of claim 9, wherein the first parallelogram end element and the flexures at the ends thereof, each comprise a plurality of parallel elements extending between the respective ends of the HGA support parallelogram element and the base parallelogram element,
wherein the parallel elements of the first parallelogram end element include:
   i. a relatively flexible flexure portion at the junction of the parallel elements of the respective end elements and an HGA support (HGAS) end of the HGA support parallelogram element and the HGA support (HGAS) end of the base parallelogram element, and
   ii. a relatively flexible flexure portion at the junction of the parallel elements of the respective end elements and a displacement force receiving (DFR) end of the HGA support parallelogram element and a displacement force receiving (DFR) end of the base parallelogram element, and iii. a relatively stiff planar core portions extending between the flexure portions of each of the parallel elements wherein the core portions are mutually parallel and perpendicular to the displacement axis.

* * * * *